(12) United States Patent
Cosemans et al.

(10) Patent No.: US 11,100,978 B2
(45) Date of Patent: Aug. 24, 2021

(54) MEMORY UNIT

(71) Applicant: SURECORE LIMITED, Leeds (GB)

(72) Inventors: Stefan Cosemans, Leeds (GB); Bram Rooseleer, Leeds (GB)

(73) Assignee: Surecore Limited, Leeds (GB)

( * ) Notice: Subject to any disclaimer, the term of this patent is extended or adjusted under 35 U.S.C. 154(b) by 148 days.

(21) Appl. No.: 16/305,596

(22) PCT Filed: Jun. 2, 2017

(86) PCT No.: PCT/GB2017/051593
§ 371 (c)(1),
(2) Date: Nov. 29, 2018

(87) PCT Pub. No.: WO2017/208016
PCT Pub. Date: Dec. 7, 2017

(65) Prior Publication Data
US 2020/0327924 A1    Oct. 15, 2020

(30) Foreign Application Priority Data
Jun. 3, 2016 (GB) ................................ 1609704

(51) Int. Cl.
*G11C 8/00* (2006.01)
*G11C 11/4094* (2006.01)
(Continued)

(52) U.S. Cl.
CPC .......... *G11C 11/4094* (2013.01); *G11C 5/145* (2013.01); *G11C 11/4074* (2013.01); *G11C 11/4087* (2013.01); *G11C 2207/005* (2013.01)

(58) Field of Classification Search
CPC .................................................. G11C 13/0069
(Continued)

(56) References Cited

U.S. PATENT DOCUMENTS 5,487,029 A    1/1996   Kuroda
5,953,246 A *  9/1999   Takashima .......... G11C 11/4074
                                                       365/149

(Continued)

OTHER PUBLICATIONS

International Search Report and Written Opinion of the International Searching Authority dated Sep. 6, 2017, from International Application No. PCT/GB2017/051593, 13 pages.

(Continued)

*Primary Examiner* — Min Huang
(74) *Attorney, Agent, or Firm* — Meunier Carlin & Curfman LLC (57) ABSTRACT

There is provided a method for accessing a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor. The method comprises connecting each of the one or more local bit lines to the corresponding global bit line by decreasing a gate voltage that is applied to a gate of the corresponding PMOS transistor to a value that is sufficient to allow the PMOS transistor to conduct, wherein the value of the gate voltage that is sufficient to allow the PMOS transistor to conduct is either a positive or negative voltage.

2 Claims, 7 Drawing Sheets

(51) Int. Cl.
*G11C 5/14* (2006.01)
*G11C 11/4074* (2006.01)
*G11C 11/408* (2006.01)

(58) Field of Classification Search
USPC .................................................. 365/189.011
See application file for complete search history.

(56) References Cited

U.S. PATENT DOCUMENTS

| | | | |
|---|---|---|---|
| 9,672,898 B1* | 6/2017 | Goel | G11C 11/419 |
| 2003/0094648 A1 | 5/2003 | Otani et al. | |
| 2006/0023553 A1 | 2/2006 | Takayama et al. | |
| 2007/0086246 A1* | 4/2007 | Sakui | G11C 16/0483 |
| | | | 365/185.17 |
| 2011/0205820 A1 | 8/2011 | Takayama et al. | |
| 2016/0172028 A1* | 6/2016 | Park | G11C 11/1657 |
| | | | 365/148 |
| 2016/0225443 A1* | 8/2016 | Chou | G11C 13/0061 |
| 2017/0345492 A1* | 11/2017 | Yoshimoto | G06F 3/0604 |

OTHER PUBLICATIONS

International Preliminary Report on Patentability dated Jul. 27, 2018, from International Application No. PCT/GB2017/051593, 8 pages.
Written Opinion of the International Preliminary Examining Authority dated Apr. 30, 2018, from International Application No. PCT/GB2017/051593, 4 pages.
Examination Report dated Jan. 31, 2020, from GB Patent Application No. GB1819572.7, 3 pages.

* cited by examiner

MEMORY UNIT

TECHNICAL FIELD

The present invention relates to a memory unit providing digital data storage. In particular, the present invention provides an improved memory unit and method for accessing a memory cell in a memory unit having a hierarchical bit line arrangement.

BACKGROUND

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

Figure 1:
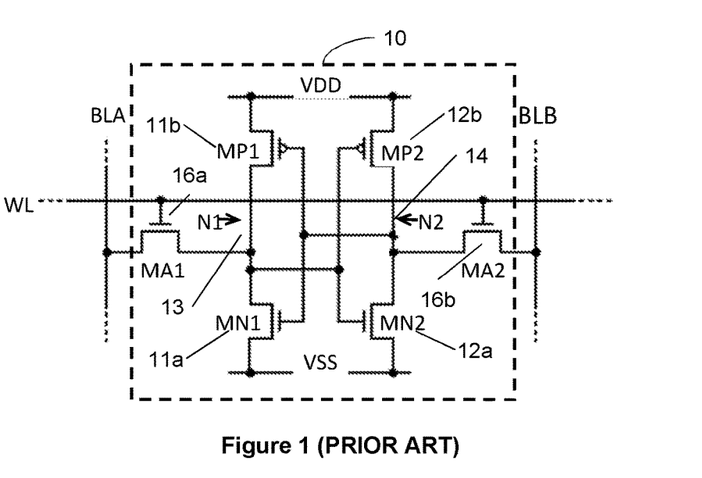
FIG. 1 illustrates a standard 6-transistor memory cell.

The most commonly-used design of SRAM memory cell is the 6-transistor circuit shown in FIG. 1 and consists of a storage element made up of two back-to-back/cross-coupled inverters ([MN1, MP1] and [MN2, MP2]) 11a, 11b, 12a, 12b with access transistors (MA1 and MA2) 16a, 16b which are turned ON by means of a word line control (WL) to form a conducting path between the data storage nodes (N1 and N2) 13, 14 of the cell and the complementary bit lines (BLA and BLB).

A write operation, in which a data value is written to a memory cell, is achieved by forcing a high voltage onto one of BLA or BLB whilst simultaneously forcing a low voltage onto the other, and then driving the word line (VVL) high to activate the access path allowing the voltage levels held on the bit lines (BLA and BLB) to overcome the state of the storage element. The word line is then driven low to disconnect the memory cell with its data store held in its new state.

A read operation, in which a data value stored in a memory cell is read, is achieved by initially driving both bit lines to a notionally high voltage level before then driving the word line (VVL) high. One of either BLA or BLB will then be pulled low through the access devices (MA1 and MA2) by the low voltage side of the storage element. The complementary bit lines are attached to inputs of a sense amplifier (not shown) that is part of the read circuitry which is used when data is read from the memory. A sense amplifier senses the low level signals present on the bit lines which represent the data value (i.e. either a '1' or a '0') stored in a given memory cell, and amplifies the small voltage swing to recognisable logic level so that the data can be interpreted properly by logic outside the memory. The difference in voltage levels between the two bit lines can therefore be sensed by the sense amplifier and used to determine the data value (i.e. '1' or '0'). The decision levels representing a '1' and a '0' will have been pre-determined during the circuit design phase and applied by the sense amplifier.

Figure 2:
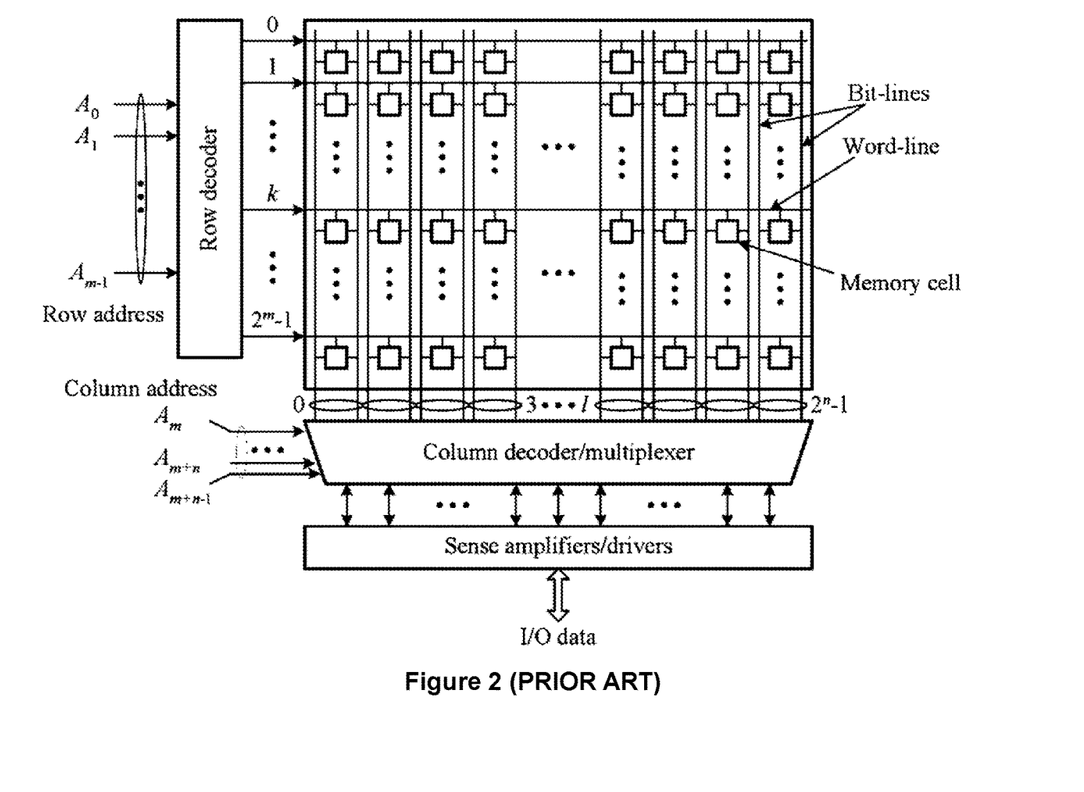
FIG. 2 illustrates an example of a conventional array of memory cells.

FIG. 2 illustrates a conventional memory unit wherein the memory cells are arranged in a two-dimensional array consisting of horizontal rows and vertical columns. Each memory cell in the array is connected to a word line that runs horizontally across a row of the array and to a pair of bit lines that run vertically within the columns. By convention the word lines are always said to run along the rows of an array of memory cells whilst the bit lines are always said to run down the columns of an array of memory cells, irrespective of the orientation of the array. The word lines are driven by a row decoder that takes an m-bit address and produces $2^m$ word line enable signals. Each pair of bit lines is then driven by a column decoder that takes an n-bit address and produces $2^n$ bit line signals.

In order to reduce delay and power dissipation, a number of different partitioning approaches have been used in which the memory array is partitioned into a number of smaller blocks that can be separately accessed. In particular, it is common for a memory array to be partitioned by the use of divided/hierarchical word lines and divided/hierarchical bit lines.

In a hierarchical word line arrangement, instead of a single word line that runs the complete width of a row of memory cells and connects to each cell in the row, a multi-level structure is used. Effectively, a single word line is broken up into multiple "local word lines", each of which connects to a group of memory cells in a part of a row of the array. A "global word line" then runs the width of the row and is connected to each of the local word lines in that column via gates/switches.

Similarly, in a hierarchical bit line arrangement in which, instead of a single bit line that runs the complete height of a column of memory cells and connects to each cell in the column, another multi-level structure is used. Effectively, a single bit line is broken up into multiple "local bit lines", each of which connects to a group of memory cells in a part of a column of the array. A "global bit line" also runs the height of the column, and is connected to each of the local bit lines in that column via an interface circuit. The memory read and write circuits connect to the global bit line, and not directly to the local bit line. During a memory access, only a local bit line in the relevant part of the column is connected to the global bit line.

The aim of the hierarchical bit line circuit is to reduce the total active capacitance due to the bit lines during a memory access, and consequently to reduce power dissipation and increase operating speed. Each memory cell connected to a bit line has a loading capacitance due to the presence of the transistor source/drain that makes the connection to the bit line. For the case of a single bit line that connects to all memory cells in a column, the total capacitance can become large, and each local bit line only sees a fraction of this load. The global bit line is loaded by the switches that connect the local and global bit lines, and each of these switches may have a larger capacitive load than an individual memory cell, but the global bit line connects to a small number of these switches rather than to all the memory cells directly, and so also has a smaller capacitive load than a single long bit line.

Figure 3:
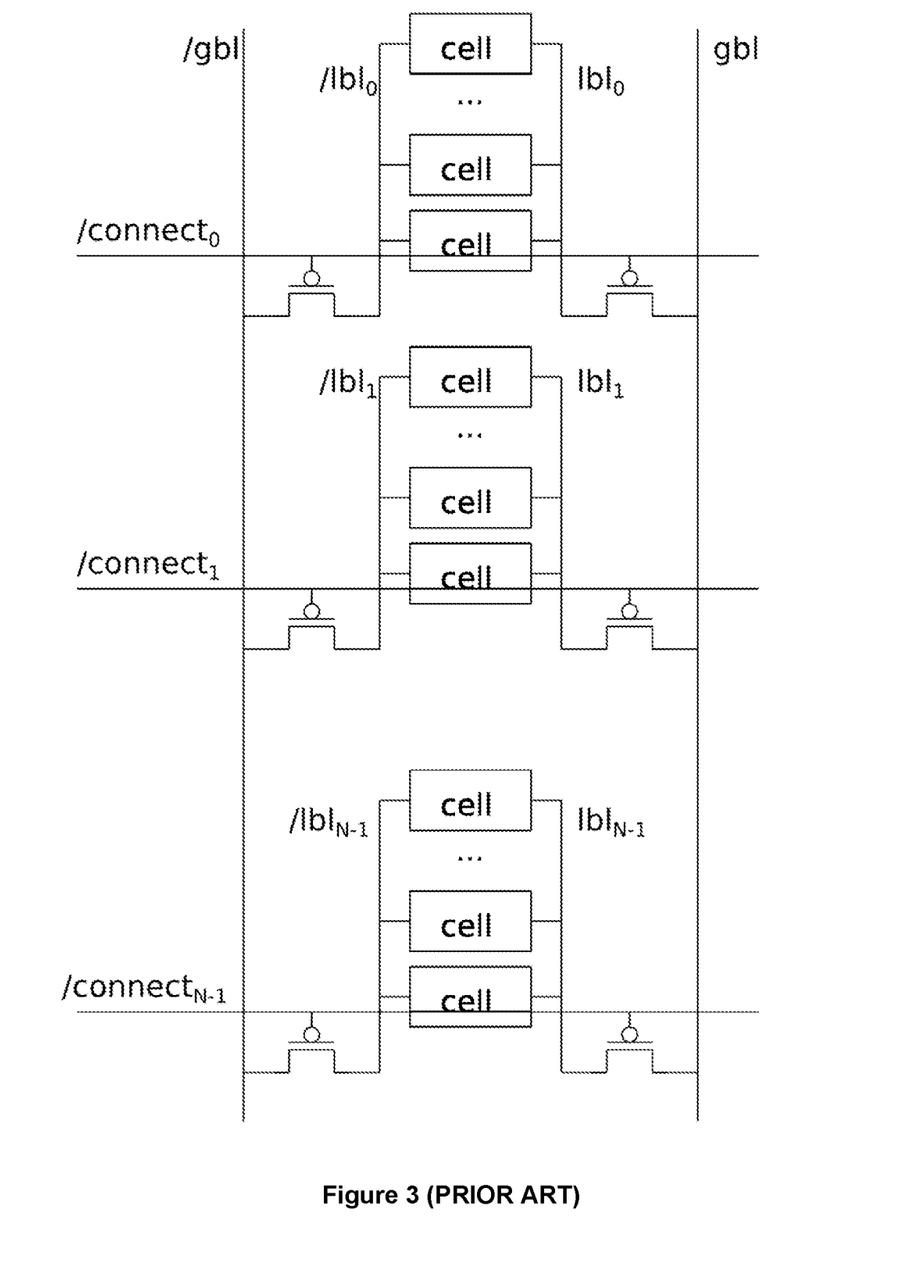
FIG. 3 illustrates an example of a memory unit having a hierarchical bit line arrangement.

FIG. 3 illustrates schematically an example of a typical memory unit having a hierarchical bit line arrangement wherein the switches that connect the local and global bit lines each comprise a passgate consisting of a PMOS transistor. This arrangement has the advantage of self-limiting the global bit line (GBL) swing to approximately $Vdd-V_T$, wherein Vdd is voltage at which the global bit lines (GBL) are pre-charged (with Vdd being the operational voltage provided to the memory unit by an external power supply) and $V_T$ being the threshold voltage of the PMOS transistors. However, the use of passgates consisting of a PMOS transistor comes with two issues.

Firstly, the swing to which the global bit lines (GBL) are limited is not necessarily optimal. In particular, when $Vdd-V_T$ is high the swing is too large. Conversely, when $Vdd-V_T$ is low the swing may be too small. This is of particular concern in designs that have to operate over a wide voltage range, e.g. from nominal voltage down to near-threshold or even sub-threshold operation. Secondly, at low supply voltage (Vdd), the discharge of global bit lines (GBL) through the PMOS transistors becomes very slow, or even worse, the swing is too low for reliable operation.

Figure 4A:
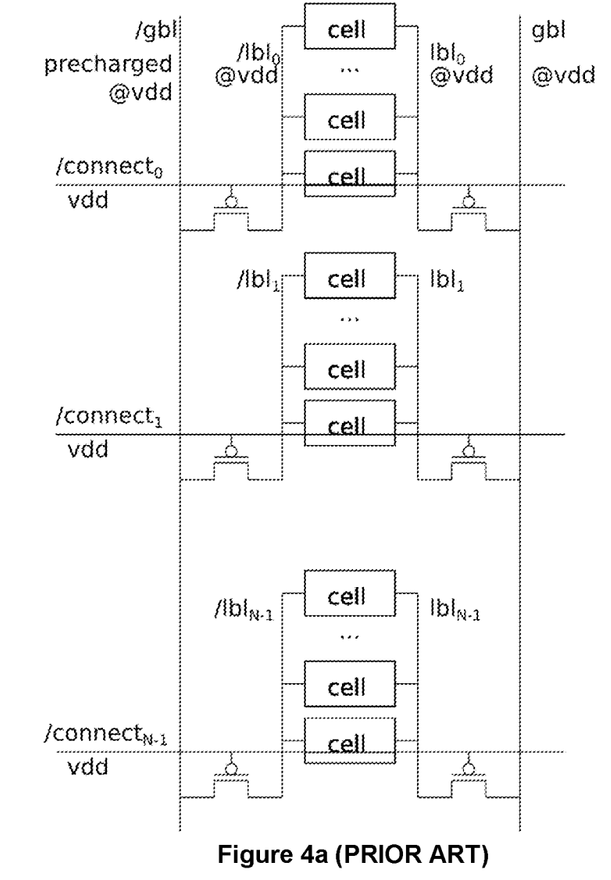
FIGS. 4a and 4b illustrate an example of a read operation for a memory unit having hierarchical bit line arrangement.
Figure 4B:
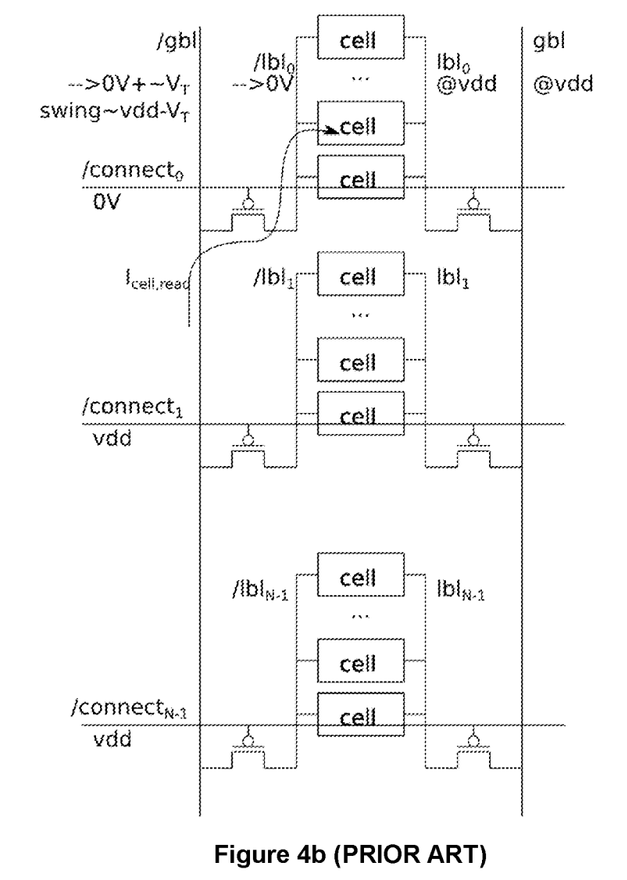

In this regard, FIGS. 4a and 4b illustrate an example of a conventional read operation implementing for a memory unit having hierarchical bit line arrangement. In FIG. 4a, the read operation begins with the global bit lines (GBL) and the local bit line (LBL) pre-charged at Vdd (with Vdd being the operational voltage provided to the memory unit by an external power supply) and the passgates that connect the global bit lines (GBL) to the local bit lines (LBL) being switched 'off' so that the global bit lines (GBL) are disconnected from the local bit lines (LBL). The word line associated with the memory cell being read is then turned on so that the data storage nodes of the memory cell are connected to the local bit lines (LBL). The memory cell therefore discharges one of the pair of local bit lines (i.e. either LBL or /LBL) dependent upon the data value stored in the memory cell. In FIG. 4b the passgates between the selected local bit lines (LBL) and the corresponding global bit lines (GBL) are then enabled by reducing the voltage applied to the gate of the PMOS transistor to 0V (i.e. /connect goes from Vdd to 0V). One of the global bit lines (GBL) therefore gets discharged through the corresponding passgate. If sufficient time is allowed, the voltage on the discharged global bit lines (GBL) evolves to approximately $0V+V_T$, wherein $V_T$ is the threshold voltage of the PMOS transistor, which corresponds to a swing of $(Vdd-V_T-0)$ and an energy consumption of $C_{GBL}*Vdd*(Vdd-V_T-0)$. However, if Vdd is close or below $V_T$, the GBL signal will be insufficient for reliable operation. Conversely, if Vdd is high, the swing is larger than necessary, resulting in wasted energy.

SUMMARY

The present inventors have therefore developed a method for accessing a memory cell in a hierarchical bit line arrangement that addresses these issues by applying either a positive or negative boost/assist voltage on the gate of a transistor within a passgate that connects a local bit line to a global bit line, with the level of positive or negative boost/assist voltage depending on the current operating voltage range. A positive boost on the gate reduces the self-limited swing, whilst a negative boost enables the use of the passgate at low supply voltage.

Therefore, according to a first aspect there is provided a method for accessing a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor. The method comprises connecting each of the one or more local bit lines to the corresponding global bit line by decreasing a gate voltage that is applied to a gate of the corresponding PMOS transistor to a value that is sufficient to allow the PMOS transistor to conduct, wherein the value of the gate voltage that is sufficient to allow the PMOS transistor to conduct is either a positive (above zero) or negative voltage (below zero). The method further comprises connecting each of the one or more local bit lines to a data storage node of the memory cell.

Preferably, the value to which the gate voltage is decreased is defined by a control signal received from an external controller. The method may further comprise receiving a control signal from an external controller, the control signal defining the gate voltage to be applied to a gate of the PMOS transistor when the PMOS transistor is required to conduct, the value defined by the control signal being either a positive (above zero) or negative voltage (below zero).

The method may further comprise generating the gate voltage and providing the gate voltage to the gate of the PMOS transistor that is required to conduct.

The method may further comprise using one or more address signals to determine which passgate is required to conduct in order to access the memory cell.

The passgate may further comprise an NMOS transistor connected in parallel with the PMOS transistor. The step of connecting each of the one or more local bit lines to the corresponding global bit line may then further comprise increasing a further gate voltage that is applied to a gate of the NMOS transistor to a value that is sufficient to allow the NMOS transistor to conduct, wherein the value of the further gate voltage that is sufficient to allow the NMOS transistor to conduct is either greater than or less than a voltage provided to the memory unit by an external power supply.

According to a second aspect there is provided a method for accessing a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a NMOS transistor. The method comprises connecting each of the one or more local bit lines to the corresponding global bit line by increasing a gate voltage that is applied to a gate of the NMOS transistor to a value that is sufficient to allow the NMOS transistor to conduct, wherein the value that is sufficient to allow the NMOS transistor to conduct is either greater than or less than a voltage provided to the memory unit by an external power supply. The method further comprises connecting each of the one or more local bit lines to a data storage node of the memory cell.

Preferably, the value to which the gate voltage is increased is defined by a control signal received from an external controller. The method may further comprise receiving a control signal from an external controller, the control signal defining the gate voltage to be applied to a gate of the NMOS transistor when the NMOS transistor is required to conduct, the value defined by the control signal being greater than or less than a voltage provided to the memory unit by an external power supply.

The method may further comprise generating the gate voltage and providing the gate voltage to the gate of the MMOS transistor that is required to conduct.

The method may further comprise using an address signal to determine which passgate is required to conduct in order to access the memory cell.

The passgate may further comprise a PMOS transistor connected in parallel with the NMOS transistor. The step of connecting each of the one or more local bit lines to the corresponding global bit line may then further comprise decreasing a further gate voltage that is applied to a gate of the PMOS transistor to a value that is sufficient to allow the PMOS transistor to conduct, wherein the value of the further gate voltage that is sufficient to allow the PMOS transistor to conduct is either a positive (above zero) or negative voltage (below zero).

According to a third aspect there is provided a memory unit. The memory unit comprises:
- a plurality of memory cell groups, each memory cell group comprising a plurality of memory cells that are each operatively connected to one or more local bit lines, each of the one or more local bit lines being operatively connected to a corresponding global bit line via a passgate comprising a PMOS transistor;
- a passgate control circuit that is configured to connect one of the local bit lines to the corresponding global bit line by decreasing a gate voltage that is applied to the gate of the PMOS transistor to a value that is sufficient to allow the PMOS transistor to conduct; and
- a voltage control circuit configured to provide the gate voltage to be used by the passgate control circuit, wherein the voltage control circuit comprises a control interface for receiving control signals that define the gate voltage to be applied to a gate of the PMOS transistor when the PMOS transistor is required to conduct, the value defined by the control signal being either a positive (above zero) or negative voltage (below zero).

According to a fourth aspect there is provided a memory unit. The memory unit comprises:
- a plurality of memory cell groups, each memory cell group comprising a plurality of memory cells that are each operatively connected to one or more local bit lines, each of the one or more local bit lines being operatively connected to a corresponding global bit line via a passgate comprising an NMOS transistor;
- a passgate control circuit that is configured to connect one of the local bit lines to the corresponding global bit line by increasing a gate voltage that is applied to the gate of the NMOS transistor to a value that is sufficient to allow the NMOS transistor to conduct; and
- a voltage control circuit configured to provide the gate voltage to be used by the passgate control circuit, wherein the voltage control circuit comprises a control interface for receiving control signals that define the gate voltage to be applied to a gate of the NMOS transistor when the NMOS transistor is required to conduct, the value defined by the control signal being greater than or less than a voltage provided to the memory unit by an external power supply.

According to a fifth aspect there is provided a method for reading a data value stored in a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor. The method comprises:
- a) pre-charging the one or more local bit lines associated with the memory cell and the corresponding global bit lines to a first voltage level;
- b) connecting each of the one or more local bit lines to a data storage node of the memory cell such that the voltage level of one of the one or more local bit lines is then dependent upon the data value stored in the memory cell;
- c) connecting each of the one or more local bit lines to the corresponding global bit line by decreasing a gate voltage that is applied to a gate of the corresponding PMOS transistor to a value that is sufficient to allow the PMOS transistor to conduct; and
- d) sensing a voltage on the one or more global bit lines to determine the data value;
  wherein the value of the gate voltage that is sufficient to allow the PMOS transistor to conduct is either a positive (above zero) or negative voltage (below zero).

According to a sixth aspect there is provided a method for writing a data value to a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor. The method comprises:
- a) driving a low voltage level onto a global bit line that is connected to a local bit line associated with the memory cell;
- b) connecting each of the one or more local bit lines associated with the memory cell to the corresponding global bit line by decreasing a gate voltage that is applied to a gate of the corresponding PMOS transistor to a value that is sufficient to allow the PMOS transistor to conduct;
- c) disconnecting each of the one or more local bit lines associated with the memory cell from the corresponding global bit line by increasing the gate voltage that is applied to a gate of the corresponding PMOS transistor to a value that is sufficient to prevent the PMOS transistor to conduct; and
- d) connecting each of the one or more local bit lines to a data storage node of the memory cell such that the data value written to the memory cell is then dependent upon the voltage level of the one or more local bit lines;
  wherein the value of the gate voltage that is sufficient to allow the PMOS transistor to conduct is either a positive (above zero) or negative voltage (below zero).

According to a seventh aspect there is provided a method for reading a data value stored in a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising an NMOS transistor. The method comprises:
- a) pre-charging the one or more local bit lines associated with the memory cell and the corresponding global bit lines to a first voltage level;
- b) connecting each of the one or more local bit lines to a data storage node of the memory cell such that the voltage level of one of the one or more local bit lines is then dependent upon the data value stored in the memory cell;
- c) connecting each of the one or more local bit lines to the corresponding global bit line by increasing a gate voltage that is applied to a gate of the NMOS transistor to a value that is sufficient to allow the NMOS transistor to conduct; and
- d) sensing a voltage on the one or more global bit lines to determine the data value;

wherein the value that is sufficient to allow the NMOS transistor to conduct is either greater than or less than a voltage provided to the memory unit by an external power supply.

According to an eighth aspect there is provided a method for writing a data value to a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a NMOS transistor. The method comprises:
  a) driving a low voltage level onto a global bit line that is connected to a local bit line associated with the memory cell;
  b) connecting each of the one or more local bit lines associated with the memory cell to the corresponding global bit line by increasing a gate voltage that is applied to a gate of the corresponding NMOS transistor to a value that is sufficient to allow the NMOS transistor to conduct;
  c) disconnecting each of the one or more local bit lines associated with the memory cell from the corresponding global bit line by decreasing the gate voltage that is applied to a gate of the corresponding NMOS transistor to a value that is sufficient to prevent the NMOS transistor to conduct; and
  d) connecting each of the one or more local bit lines to a data storage node of the memory cell such that the data value written to the memory cell is then dependent upon the voltage level of the one or more local bit lines;
  wherein the value that is sufficient to allow the NMOS transistor to conduct is either greater than or less than a voltage provided to the memory unit by an external power supply.

BRIEF DESCRIPTION OF THE DRAWINGS

The present invention will now be more particularly described by way of example only with reference to the accompanying drawings, in which.

DETAILED DESCRIPTION

There will now be described a method for accessing a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor. This method involves connecting each of the one or more local bit lines associated with the memory cell group of the memory cell being accessed to the corresponding global bit line by decreasing a gate voltage that is applied to a gate of the corresponding PMOS transistor to a value that is sufficient to allow the PMOS transistor to conduct, wherein the value of the gate voltage that is sufficient to allow the PMOS transistor to conduct is either a positive (i.e. above zero) or negative voltage (i.e. below zero). The method further comprises connecting each of the one or more local bit lines to a data storage node of the memory cell. In this regard, depending upon the access operation being performed (i.e. a read or write operation), the step of connecting each of the one or more local bit lines to a data storage node of the memory cell can be implemented before, after or simultaneously with the step of connecting each of the one or more local bit lines to the corresponding global bit line.

As detailed above, a conventional read operation for such a memory unit involves reducing the voltage applied to the gate of the PMOS transistor to 0V. In contrast, the present inventors have developed a method for accessing a memory cell in a hierarchical bit line arrangement that addresses the issues that arise when using PMOS passgates to connect local bit lines to global bit lines. This is achieved by applying either a positive or negative boost/assist voltage on the gate of a transistor within a passgate that connects a local bit line to a global bit line, with the level of positive or negative boost depending on the current operating voltage range.

The value to which the gate voltage is decreased is preferably defined by a control signal received from an external controller. The method then further comprises receiving a control signal from an external controller, the control signal defining the gate voltage to be applied to a gate of the PMOS transistor when the PMOS transistor is required to conduct, the value defined by the control signal being either a positive (above zero) or negative voltage (below zero). In this regard, when the memory unit is used in a system-on-a-chip (SoC) environment, there will typically be a power controller which adjusts operating voltage levels in various parts of a system in order to save power. Whilst the reduced operating voltages would normally be incompatible with memory operation, the methods described herein provides a means to allow the memory to continue operation even with a reduced supply, as the power controller can determine a value for the boost/assist voltage to be applied to the passgates depending on whether and how much the supply that the memory is deployed on has been reduced.

The advantage of the circuits and methods described herein is that it enables operation over a wider range of overall voltage without imposing specific demands based on the needs of the memory unit (which are generally more restrictive), thus allowing more flexibility in the SoC power optimisation. Furthermore, the circuits and methods described herein also provide that the use of a boosted/assist voltage can be enabled or disabled, and the level of any boosted/assist voltage chosen, by the power controller depending upon the operating conditions (e.g. Vdd, temperature, corner etc.), and depending upon the operation being performed.

Figure 5:
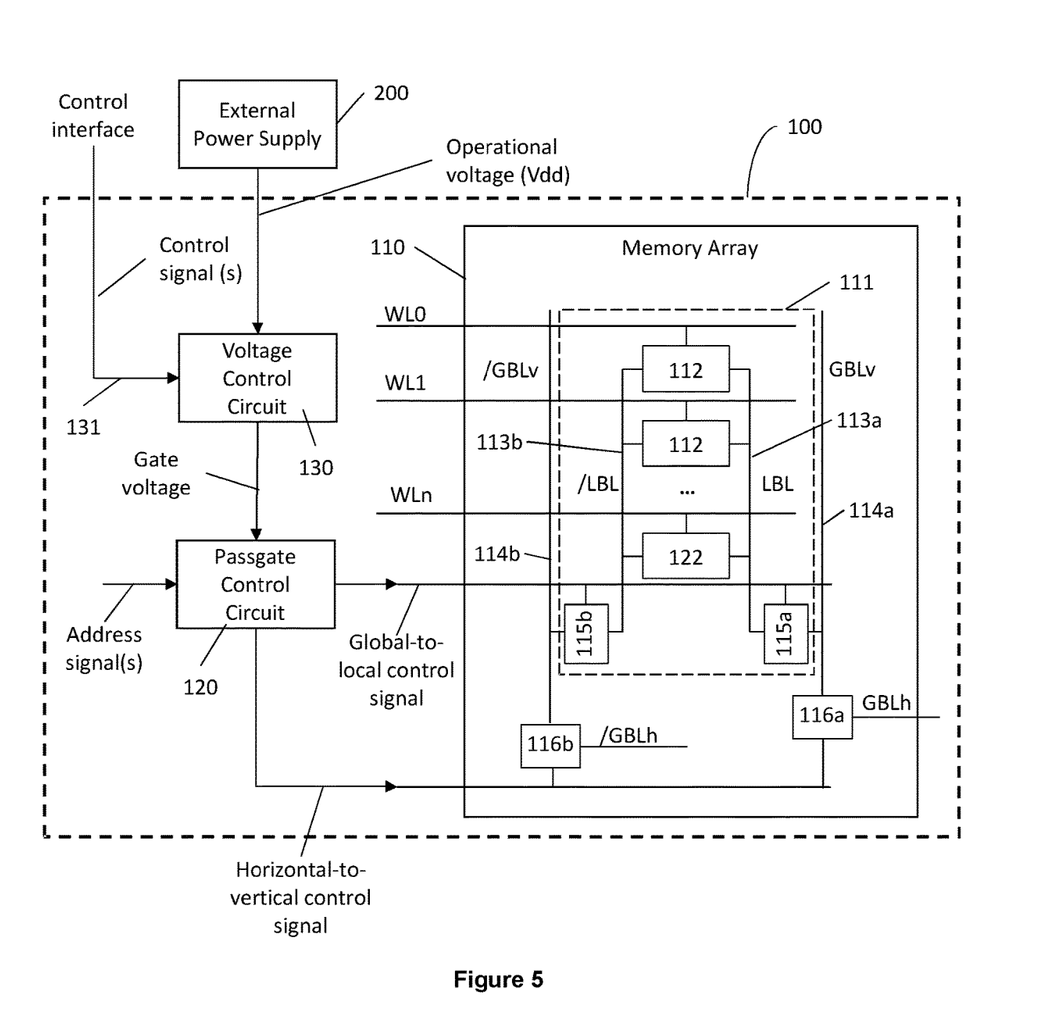
FIG. 5 illustrates schematically an example of a memory unit as described herein.

FIG. 5 illustrates schematically an example of a memory unit 100 suitable for implementing the methods described herein. The memory unit 100 has a hierarchical bit line arrangement and therefore comprises a memory array 110 comprising a plurality of memory cell groups 111, each memory cell group comprising a plurality of memory cells 112 that are each operatively connected to one or more local bit lines 113a, 113b, each of the one or more local bit lines being operatively connected to a corresponding global bit line 114, 114b, via a passgate 115.

The memory unit 100 also comprises a passgate control circuit 120 that is configured to connect one of the local bit lines to the corresponding global bit line. In the embodiment in which the passgates 115 each comprise a PMOS transistor, the passgate control circuit 120 is configured to connect one of the local bit lines to the corresponding global bit line by decreasing a gate voltage that is applied to the gate of the PMOS transistor to a value that is sufficient to allow the PMOS transistor to conduct.

The passgate control circuit 120 will be part of the decoder circuitry within the memory unit 100 that decodes an address (i.e. a plurality of address bits) for a memory cell to be accessed and thereby generates one or more address signals that each address an appropriate portion/subset of the array of memory cells. The passgate control circuit 120 will therefore be configured to receive one or more address signals and to use these one or more address signals to determine which of the passgates within the memory array 110 need to be selected in order to access the addressed memory cell(s). The method described herein may therefore also comprise using one or more address signals to determine which passgate is required to conduct in order to access the memory cell.

The memory unit 100 then further comprises a voltage control circuit 130 that is configured to provide the gate voltage to be used by the passgate control circuit 120. The voltage control circuit 130 comprises a control interface 131 for receiving control signals that define the gate voltage to be applied to a gate of a transistor within a passgate 115 when the passgate is required to conduct. In the embodiment in which the passgates 115 each comprise a PMOS transistor the value defined by the control signal will be either a positive (above zero) or negative voltage (below zero). The method described herein may therefore also further comprise generating the gate voltage and providing the gate voltage to the gate of a PMOS transistor that is required to conduct.

It should be noted that the herein described methods for accessing a memory cell in a hierarchical bit line arrangement are applicable to both read and write operations. For example, when used to implement a read operation via a passgate comprising a PMOS transistor, the methods described herein can comprise the following steps:
1-1) Pre-charging the one or more local bit lines associated with the memory cell and the corresponding global bit lines to a first voltage level.
1-2) Connecting each of the one or more local bit lines to a data storage node of the memory cell such that the voltage level of one of the one or more local bit lines is then dependent upon the data value stored in the memory cell.
1-3) Connecting each of the one or more local bit lines to the corresponding global bit line by decreasing a gate voltage that is applied to a gate of the corresponding PMOS transistor to a value that is sufficient to allow the PMOS transistor to conduct, wherein the value of the gate voltage that is sufficient to allow the PMOS transistor to conduct is either a positive (above zero) or negative voltage (below zero).
1-4) Sensing a voltage on the one or more global bit lines to determine the data value.

Figure 6A:
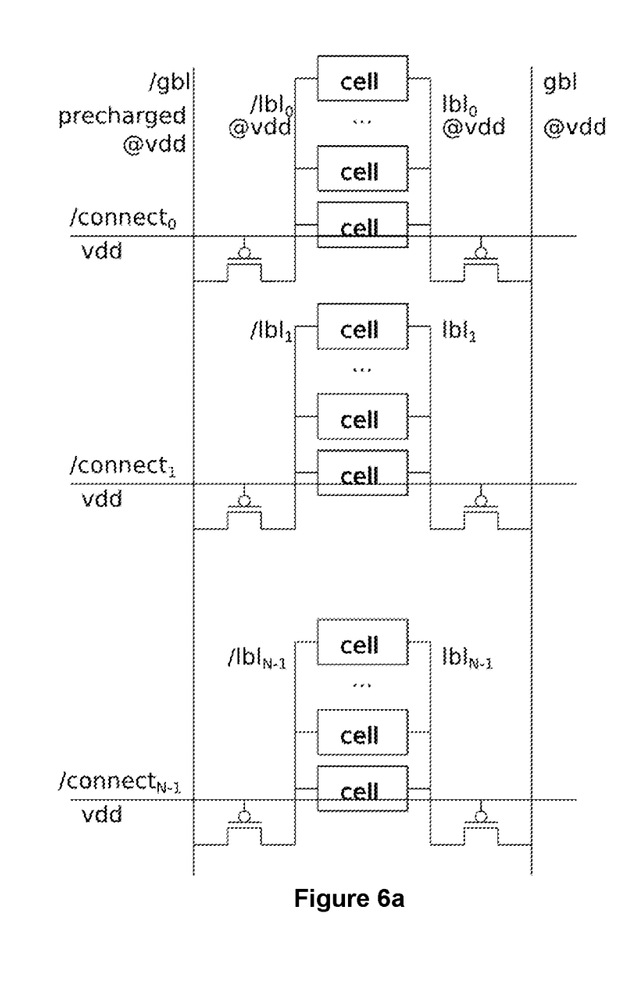
FIGS. 6a and 6b illustrate an example of a read operation implemented using the memory unit as described herein.
Figure 6B:
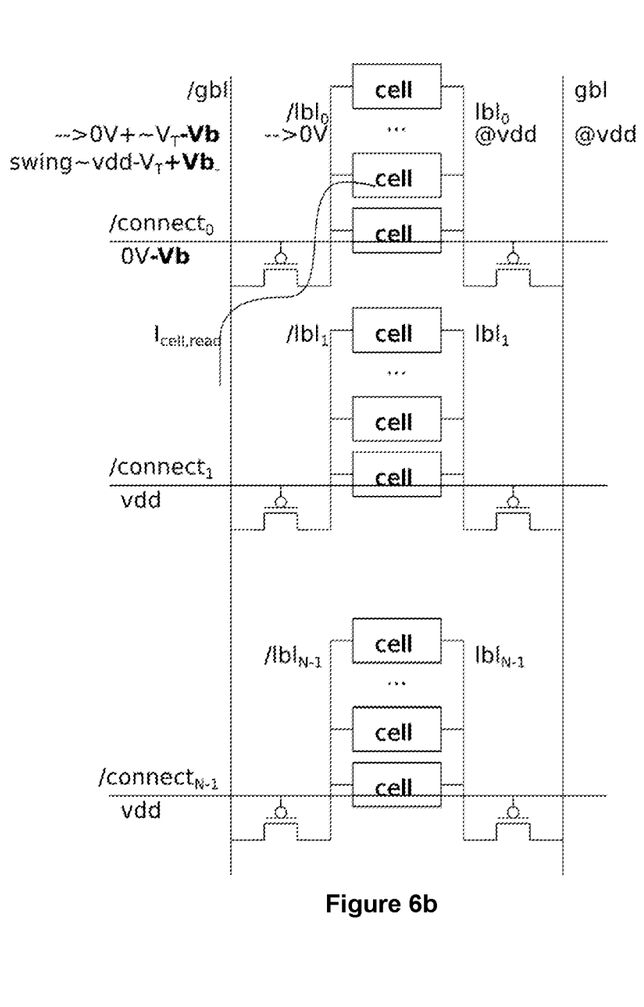

FIGS. 6a and 6b illustrate an example of such a read operation implemented using the memory unit as described herein that increases the global bit line (GBL) swing or speed. In FIG. 6a, the read operation begins with the global bit lines (GBL) and the local bit line (LBL) pre-charged at Vdd (with Vdd being the operational voltage provided to the memory unit by an external power supply) and the passgates that connect the global bit lines (GBL) to the local bit lines (LBL) being switched 'off' so that the global bit lines (GBL) are disconnected from the local bit lines (LBL). The word line associated with the memory cell being read is then turned on so that the data storage nodes of the memory cell are each connected to one of the local bit lines (LBL). The memory cell therefore discharges one of the pair of local bit lines (i.e. either LBL or /LBL) dependent upon the data value stored in the memory cell. In FIG. 6b the passgates between the selected local bit lines (LBL) and the corresponding global bit lines (GBL) are then enabled by reducing the voltage applied to the gate of the PMOS transistor to $0-V_b$, wherein $V_b$ is the boost/assist voltage (i.e. /connect goes from Vdd to $0-V_b$). One of the global bit lines (GBL) therefore gets discharged through the corresponding passgate. If sufficient time is allowed, the voltage on the discharged global bit lines (GBL) therefore evolves to approximately $-V_b+V_T$, wherein $V_T$ is the threshold voltage of the PMOS transistor, which corresponds to a swing of approximately $(Vdd-V_T+V_b)$. Consequently, by using a boost/assist voltage on the gate of the PMOS transistor within the passgate sufficient swing can be achieved, or the required swing can be achieved in less time.

Figure 7A:
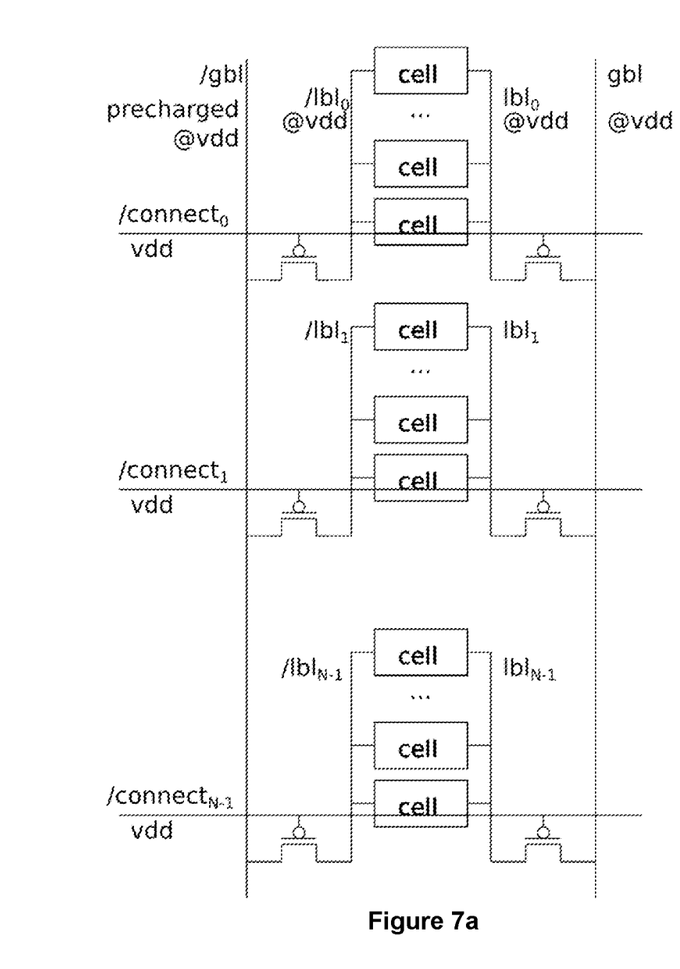
FIGS. 7a and 7b illustrate an example of a read operation implemented using the memory unit as described herein.
Figure 7B:
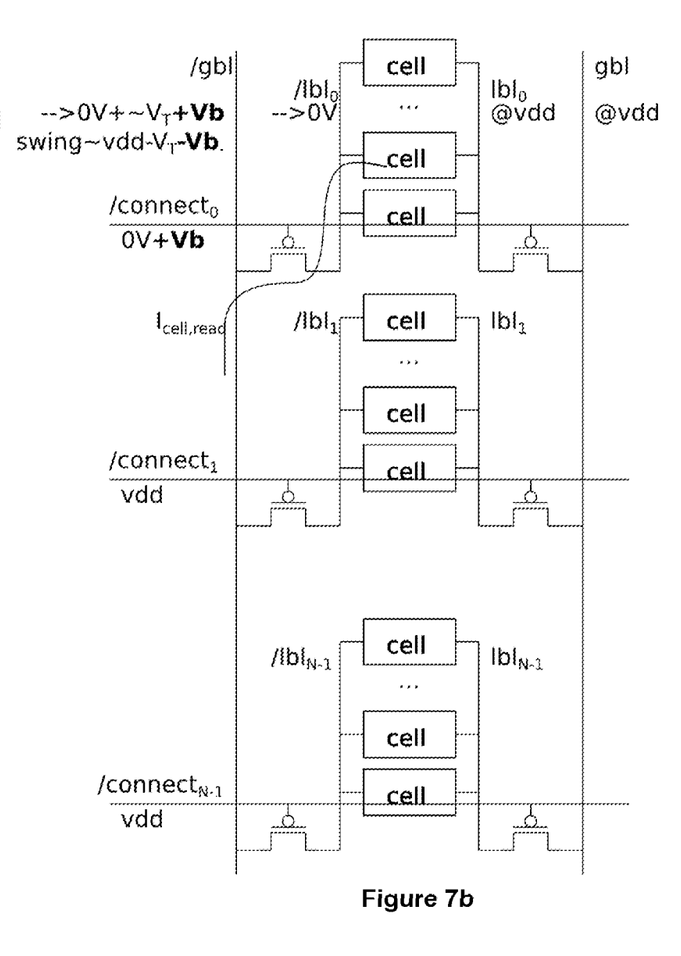
Figures 8A, 8B:
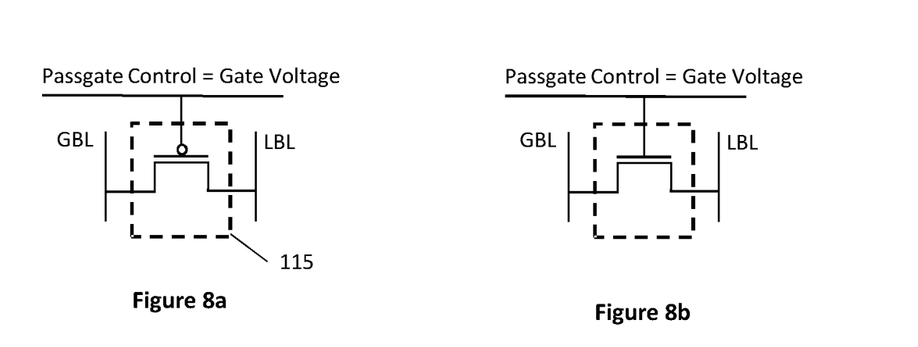
FIGS. 8a, 8b and 8c each illustrate different examples of the switch circuit used to connect bit lines at different levels within the hierarchical bit line arrangement.
Figure 8C:
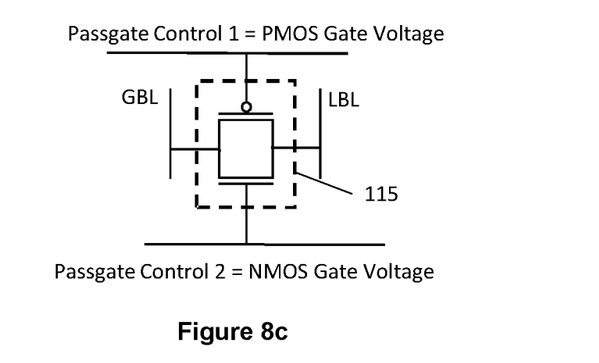

FIGS. 7a and 7b then illustrate an example of such a read operation implemented using the memory unit as described herein that reduces the global bit line (GBL) swing and thereby reduces energy consumption. In FIG. 7a, the read operation begins with the global bit lines (GBL) and the local bit line (LBL) pre-charged at Vdd (with Vdd being the operational voltage provided to the memory unit by an external power supply) and the passgates that connect the global bit lines (GBL) to the local bit lines (LBL) being switched 'off' so that the global bit lines (GBL) are disconnected from the local bit lines (LBL). The word line associated with the memory cell being read is then turned on so that the data storage nodes of the memory cell are each connected to one of the local bit lines (LBL). The memory cell therefore discharges one of the pair of local bit lines (i.e. either LBL or /LBL) dependent upon the data value stored in the memory cell. In FIG. 7b the passgates between the selected local bit lines (LBL) and the corresponding global bit lines (GBL) are then enabled by reducing the voltage applied to the gate of the PMOS transistor to $0+V_b$ wherein $V_b$ is the boost/assist voltage (i.e. /connect goes from Vdd to $0+V_b$). One of the global bit lines (GBL) therefore gets discharged through the corresponding passgate. If sufficient time is allowed, the voltage on the discharged global bit lines (GBL) therefore evolves to approximately $V_b+V_T$, wherein $V_T$ is the threshold voltage of the PMOS transistor, which corresponds to a swing of approximately $(Vdd-V_T-V_b)$ and an energy consumption of $C_{GBL}*Vdd*(Vdd-V_T-V_b)$. Consequently, by using a boost/assist voltage on the gate of the PMOS transistor within the passgate energy consumption can be significantly reduced without the need for accurate timing.

As a further example, when used to implement a write operation via a passgate comprising a PMOS transistor, the methods described herein can comprise the following steps:

2-1) Driving a low voltage level onto a global bit line that is connected to a local bit line associated with the memory cell.

2-2) Connecting each of the one or more local bit lines associated with the memory cell to the corresponding global bit line by decreasing a gate voltage that is applied to a gate of the corresponding PMOS transistor to a value that is sufficient to allow the PMOS transistor to conduct, wherein the value of the gate voltage that is sufficient to allow the PMOS transistor to conduct is either a positive (above zero) or negative voltage (below zero).

2-3) Disconnecting each of the one or more local bit lines associated with the memory cell from the corresponding global bit line by increasing the gate voltage that is applied to a gate of the corresponding PMOS transistor to a value that is sufficient to prevent the PMOS transistor to conduct.

2-4) Connecting each of the one or more local bit lines to a data storage of the memory cell such that the data value written to the memory cell is then dependent upon the voltage level of the one or more local bit lines.

In practice, when implementing a write operation for a conventional six transistor SRAM memory cell, the local bit lines (LBL) needs to be driven strongly to a voltage close to 0V. When using only a PMOS gate between global bit lines (GBL) and the local bit lines (LBL), some form of local amplification will therefore usually be required. For example, a typical option for this local amplification is a cross-coupled NMOS pair connecting the complimentary pair of local bit lines (LBL) to ground/Vss via a write enable transistor. Consequently, the write operation could further comprise a step of enabling a local amplification to drive low the voltage level on one of the local bit lines (LBL).

In addition, whilst it is preferable for the steps of the write operation to be performed in the order given above, it should be noted that it is possible for the local bit lines to be connected to the data storage nodes of the memory cell (i.e. by enabling the corresponding word line so as to turn on the access transistors within the memory cell) immediately prior to or simultaneously with the disconnection of the local bit lines from the global bit lines. Similarly, when using local amplification, it is also possible for the local amplification to be enabled immediately prior to or simultaneously with the disconnection of the local bit lines from the global bit lines and/or for the local bit lines to be connected to the data storage nodes of the memory cell immediately prior to or simultaneously with the triggering of the local amplification.

In addition, it should be also noted that the herein described methods for accessing a memory cell in a hierarchical bit line arrangement are also applicable to memory units in which the local bit lines are each connected to a corresponding global bit line via a passgate comprising a NMOS transistor. In this regard, FIGS. 6a, 6b and 6c each illustrate different examples of the passgate circuit 115 that is used to connect bit lines at different levels within a hierarchical bit line arrangement. In the example of FIG. 6a the passgate consists of a PMOS transistor wherein the control signal from the passgate control circuit is provided to the gate of the PMOS transistor. In the example of FIG. 6b the passgate consists of an NMOS transistor wherein the control signal from the passgate control circuit is provided to the gate of the NMOS transistor. In the example of FIG. 6c the passgate comprises a transmission gate that consists of an NMOS transistor connected in parallel with the PMOS transistor. In this example, the passgate control circuit is configured to provide two separate control signals; a first control signal is provided to the gate of the PMOS transistor, whilst a second control signal is provided to the gate of the NMOS transistor.

In the case of the passgate comprising a transmission gate that consists of an NMOS transistor connected in parallel with the PMOS transistor then it is preferable that the voltages applied to the gates of both transistors are boosted, with the gate voltage applied to the NMOS transistor being boosted in the opposite direction to that of the PMOS transistor. The above described methods for accessing a memory cell in a hierarchical bit line arrangement may further comprise a step of increasing a further gate voltage that is applied to a gate of the NMOS transistor to a value that is sufficient to allow the NMOS transistor to conduct, wherein the value of the further gate voltage that is sufficient to allow the NMOS transistor to conduct is either greater than or less than a voltage provided to the memory unit by an external power supply. Whilst it is preferable that the voltages applied to the gates of both transistors are boosted there may be regions of operation where boost of just the NMOS would be sufficient.

Similarly, in the case of the passgate consisting of an NMOS transistor the method for accessing a memory cell in a hierarchical bit line arrangement will then comprise connecting each of the one or more local bit lines to the corresponding global bit line by increasing a gate voltage that is applied to a gate of the NMOS transistor to a value that is sufficient to allow the NMOS transistor to conduct, wherein the value that is sufficient to allow the NMOS transistor to conduct is either greater than or less than a voltage provided to the memory unit by an external power supply.

In either of these cases the voltage control circuit 130 will be configured to provide a gate voltage to be used by the passgate control circuit 120 that is either greater than or less than a voltage provided to the memory unit 100 by an external power supply 200. In this regard, the voltage provided to the memory unit 100 by an external power supply 200 will be the operational voltage (Vdd) used by the memory unit 100 wherein this operational voltage is that which is usually supplied to various circuit elements that make up the memory unit 100. However, in this example, the voltage control circuit 130 is provided so that a 'boosted' gate voltage (Vdd+) that differs from the supply voltage can be supplied to the passgate control circuit 120 as and when required. By way of example, the voltage control circuit 130 could provide the 'boosted' drive voltage (Vdd+) internally using capacitive coupling.

The control signals received from the external controller would then define a gate voltage to be applied to a gate of the NMOS transistor when the NMOS transistor is required to conduct, the value defined by the control signal being greater than or less than a voltage provided to the memory unit by an external power supply. In practice, an NMOS transistor within a passgate will typically be required to conduct signals at the local/global bit line voltage level (depending upon whether the operation is a read or a write) such that the gate voltage of the NMOS transistor will need to be boosted to be above that voltage by an amount that is at least equal to its threshold voltage $V_T$ (i.e. $V_{GS}=V_G-V_S>V_T$ so $V_G>V_S+V_T$).

For example, when used to implement a read operation via a passgate comprising an NMOS transistor, the methods described herein can therefore comprise the following steps:

3-1) Pre-charging the one or more local bit lines associated with the memory cell and the corresponding global bit lines to a first voltage level.

3-2) Connecting the one or more local bit lines to the memory cell such that the voltage level of one of the one or more local bit lines is then dependent upon the data value stored in the memory cell.

3-3) Connecting each of the one or more local bit lines to the corresponding global bit line by increasing a gate voltage that is applied to a gate of the NMOS transistor to a value that is sufficient to allow the NMOS transistor to conduct, wherein the value that is sufficient to allow the NMOS transistor to conduct is either greater than or less than a voltage provided to the memory unit by an external power supply.

3-4) Sensing a voltage on the one or more global bit lines to determine the data value;

By way of further example, when used to implement a write operation via a passgate comprising an NMOS transistor, the methods described herein can comprise the following steps:

4-1) Driving a low voltage level onto a global bit line that is connected to a local bit line associated with the memory cell.

4-2) Connecting each of the one or more local bit lines associated with the memory cell to the corresponding global bit line by increasing a gate voltage that is applied to a gate of the corresponding NMOS transistor to a value that is sufficient to allow the NMOS transistor to conduct, wherein the value that is sufficient to allow the NMOS transistor to conduct is either greater than or less than a voltage provided to the memory unit by an external power supply.

4-3) Disconnecting each of the one or more local bit lines associated with the memory cell from the corresponding global bit line by decreasing the gate voltage that is applied to a gate of the corresponding NMOS transistor to a value that is sufficient to prevent the NMOS transistor to conduct.

4-4) Connecting the one or more local bit lines to the memory cell such that the data value written to the memory cell is then dependent upon the voltage level of the one or more local bit lines.

It will be appreciated that individual items described above may be used on their own or in combination with other items shown in the drawings or described in the description and that items mentioned in the same passage as each other or the same drawing as each other need not be used in combination with each other. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only.

Those skilled in the art will be able to make modifications and alternatives in view of the disclosure which are contemplated as falling within the scope of the appended claims. For example, those skilled in the art will appreciate that the above-described invention might be equally applicable to other types of memory. By way of further example, whilst the above-described embodiments refer to passgates within a hierarchical bit line arrangement that connect local bit lines to corresponding global bit lines, these methods are equally applicable to passgates at different locations in the bit line hierarchy. In particular, the above described methods are equally applicable to passgates that connect horizontal global bit lines ($GBL_h$) to vertical global bit lines ($GBL_v$), such as the passgates 116a, 116b illustrated in FIG. 5. In this case, the voltage control circuit 130 would be configured to provide the boost/assist gate voltage to the passgate control circuit(s) that control these horizontal-to-vertical passgates 116a, 116b.

The invention claimed is:

1. A method for writing a data value to a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a PMOS transistor, the method comprising:
  a) driving a low voltage level onto a global bit line that is connected to a local bit line associated with the memory cell;
  b) determining a value for a gate voltage to be applied to a gate of the PMOS transistor, that is sufficient to allow the PMOS transistor to conduct, depending on a voltage provided to the memory unit by an external power supply;
  c) connecting each of the one or more local bit lines associated with the memory cell to the corresponding global bit line by decreasing the gate voltage that is applied to the gate of the corresponding PMOS transistor to said value that is sufficient to allow the PMOS transistor to conduct;
  d) disconnecting each of the one or more local bit lines associated with the memory cell from the corresponding global bit line by increasing the gate voltage that is applied to the gate of the corresponding PMOS transistor to a value that is sufficient to prevent the PMOS transistor to conduct; and
  e) connecting each of the one or more local bit lines to a data storage node of the memory cell such that the data value written to the memory cell is then dependent upon the voltage level of the one or more local bit lines;
    wherein the value of the gate voltage that is sufficient to allow the PMOS transistor to conduct is either a positive (above zero) or negative voltage (below zero).

2. A method for writing a data value to a memory cell of a plurality of memory cells that are part of a memory unit, the memory cells being grouped into a plurality of memory cell groups, wherein each memory cell group is associated with one or more local bit lines with each of the one or more local bit lines being operatively connected to a corresponding global bit line via a passgate comprising a NMOS transistor, the method comprising:
  a) driving a low voltage level onto a global bit line that is connected to a local bit line associated with the memory cell;
  b) determining a value for a gate voltage to be applied to a gate of the NMOS transistor that is sufficient to allow the NMOS transistor to conduct, based on a voltage provided to the memory unit by an external power supply;
  c) connecting each of the one or more local bit lines associated with the memory cell to the corresponding global bit line by increasing the gate voltage that is applied to the gate of the corresponding NMOS transistor to said value that is sufficient to allow the NMOS transistor to conduct;
  d) disconnecting each of the one or more local bit lines associated with the memory cell from the corresponding global bit line by decreasing the gate voltage that is applied to the gate of the corresponding NMOS transistor to a value that is sufficient to prevent the NMOS transistor to conduct; and e) connecting each of the one or more local bit lines to a data storage node of the memory cell such that the data value written to the memory cell is then dependent upon the voltage level of the one or more local bit lines; wherein the value that is sufficient to allow the NMOS transistor to conduct is either greater than or less than a voltage provided to the memory unit by an external power supply.

\* \* \* \* \*